(12) United States Patent
Onodera et al.

(10) Patent No.: US 7,749,901 B2
(45) Date of Patent: Jul. 6, 2010

(54) METHOD FOR FORMING A TAPERED VIA OF A SEMICONDUCTOR DEVICE

(75) Inventors: Ken Onodera, Kawasaki (JP);
Kazutaka Takagi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/300,793

(22) PCT Filed: Nov. 28, 2007

(86) PCT No.: PCT/JP2007/072899
§ 371 (c)(1),
(2), (4) Date: Nov. 14, 2008

(87) PCT Pub. No.: WO2008/066059
PCT Pub. Date: Jun. 5, 2008

(65) Prior Publication Data
US 2009/0146261 A1    Jun. 11, 2009

(30) Foreign Application Priority Data
Nov. 30, 2006    (JP)    .............................. 2006-323751

(51) Int. Cl.
*H01L 23/522*    (2006.01)
*H01L 21/768*    (2006.01)
(52) U.S. Cl. ............... 438/667; 438/597; 257/E21.477; 257/E21.575
(58) Field of Classification Search ................. 438/597, 438/666, 667; 257/621, E21.477, E23.01, 257/E21.575
See application file for complete search history.

(56) References Cited

U.S. PATENT DOCUMENTS

| 2002/0031650 A1* | 3/2002 | Fischer et al. ............... 428/209 |
| 2005/0184362 A1* | 8/2005 | Fujita ............................ 257/620 |
| 2007/0069286 A1* | 3/2007 | Brar et al. ..................... 257/330 |

FOREIGN PATENT DOCUMENTS

| JP | 61 50347 | 3/1986 |
| JP | 63 207132 | 8/1988 |

(Continued)

OTHER PUBLICATIONS

S. Kim, et al., "SiC Via by Laser Drilling", Journal of Electronic Materials, vol. 33, No. 5, pp. 477-480, (2004).

*Primary Examiner*—Julio J Maldonado
*Assistant Examiner*—Michele Fan
(74) *Attorney, Agent, or Firm*—Oblon, Spivak, McClelland, Maier & Neustadt, L.L.P.

(57) ABSTRACT

A semiconductor device having a VIA hole without disconnection caused by step is achieved.

A semiconductor device and its manufacturing method, the semiconductor device comprising: a semi-insulating substrate 11 in which an electrode (12) is formed on a surface (11*a*) of one side and in which an aperture (11*c*) passed through from the surface 11*a* of one side to a surface (11*b*) of another side is formed; and a conductive layer (17) formed in an inner surface of the aperture (11*c*), and electrically connected with the electrode (12); wherein the aperture (11*c*) has a tapered region (11*d*) where an inside diameter of a part located in the surface (11*b*) of another side is larger than an inside diameter of a part located in the surface (11*a*) of one side.

3 Claims, 2 Drawing Sheets

FOREIGN PATENT DOCUMENTS

| | | | |
|---|---|---|---|
| JP | 63207132 A * | 8/1988 |
| JP | 2 288409 | 11/1990 |
| JP | 5 102106 | 4/1993 |
| JP | 6 326064 | 11/1994 |
| JP | 2001 28425 | 1/2001 |

* cited by examiner

METHOD FOR FORMING A TAPERED VIA OF A SEMICONDUCTOR DEVICE

TECHNICAL FIELD

The present invention relates to a semiconductor device used with a high frequency band, and a fabrication method of the semiconductor device.

BACKGROUND ART

A semiconductor device, for example, a microwave amplification device, which are used with a high frequency band, composed of active elements, such as a field effect type transistor, passive elements, such as a resistance and a capacitor, and circuit elements, such as a microstrip line for transmitting a high frequency signal, and these circuit elements are formed for example, on a semi-insulating substrate. A ground conductor is formed on an opposite surface of the semi-insulating substrate. And, when grounding a circuit element, the circuit element provided on the semi-insulating substrate and the ground conductor formed on the back side of the semi-insulating substrate are electrically connected through a VIA (via) hole for passing through the semi-insulating substrate, for example.

The VIA-hole provides a through hole passed through from one surface to a surface of another side of the semi-insulating substrate, and is having structure which forms a conductive layer in an inner surface of the through hole. The through hole is formed, for example by etching, and the conductive layer is formed by plating, vacuum evaporation, etc.

The VIA-hole of a configuration described above has some which are described in the Patent Document 1 etc.

Patent Document 1: Japanese Patent Application Laid-Open Publication No. H02-288409.

As the conventional semiconductor device described above, the VIA-hole is formed, for example by etching, and the conductive layer formed in the inner surface of the VIA-hole is formed by methods, such as plating and vacuum evaporation.

However, when forming the conductive layer in the inner surface of the VIA-hole, the so-called "disconnection caused by step", by which metal performing the plating or the vacuum evaporation is not fully formed and the conductive layer is not formed in a part of inner surface of the VIA-hole, may occur. As a result, grounding of the circuit element becomes insufficient and it becomes a cause by which the electrical characteristics of a microwave amplification device etc. deteriorate.

The object of the present invention is to provide a semiconductor device for solving the above-mentioned fault and preventing the disconnection caused by step of the VIA-hole, etc., and a fabrication method of the semiconductor device.

DISCLOSURE OF INVENTION

According to one aspect of the present invention for achieving the above-mentioned object, a fabrication method of a semiconductor device is provided. The fabrication method of the semiconductor device includes: a first step of forming a mask layer which is composed of material whose etching rate is smaller than a semi-insulating substrate on a surface of another side of the semi-insulating substrate where an electrode is formed on a surface of one side; a second step of forming a resist layer on the mask layer; a third step of illuminating the resist layer through a mask pattern which provides a region along which light passes, and forming a first aperture in the resist layer; a fourth step of heating the resist layer in which the first aperture is formed, and forming a first tapered region where a thickness becomes thin toward the first aperture side around the first aperture of the resist layer; a fifth step, after the fourth step, of forming a second aperture that a part of the surface of the another side of the semi-insulating substrate exposes by etching the mask layer using the first aperture of the resist layer, and forming a second tapered region where a thickness becomes thin toward the second aperture side around the second aperture; a sixth step, after the fifth step, of removing the resist layer which remains on the mask layer; a seventh step, after the sixth step, of forming a third aperture having a third tapered region where an inside diameter of a part located in the surface of the another side of the semi-insulating substrate is larger than an inside diameter of a part located in the surface of one side by etching the semi-insulating substrate using the second aperture; and an eighth step of forming a conductive layer in an inner surface of the third aperture.

According to other aspects of the present invention, a semiconductor device is provided. The semiconductor device includes: a semi-insulating substrate composed of GaN or SiC in which an electrode is formed on a surface of one side and in which a VIA-hole passed through from the surface of one side to a surface of another side is formed; and a conductive layer formed in an inner surface of the VIA-hole, and electrically connected with the electrode; wherein an inside diameter of a part located in the surface of the another side of the VIA-hole is larger than an inside diameter of a part located in the surface of one side.

BEST MODE FOR CARRYING OUT THE INVENTION

Figure 1:
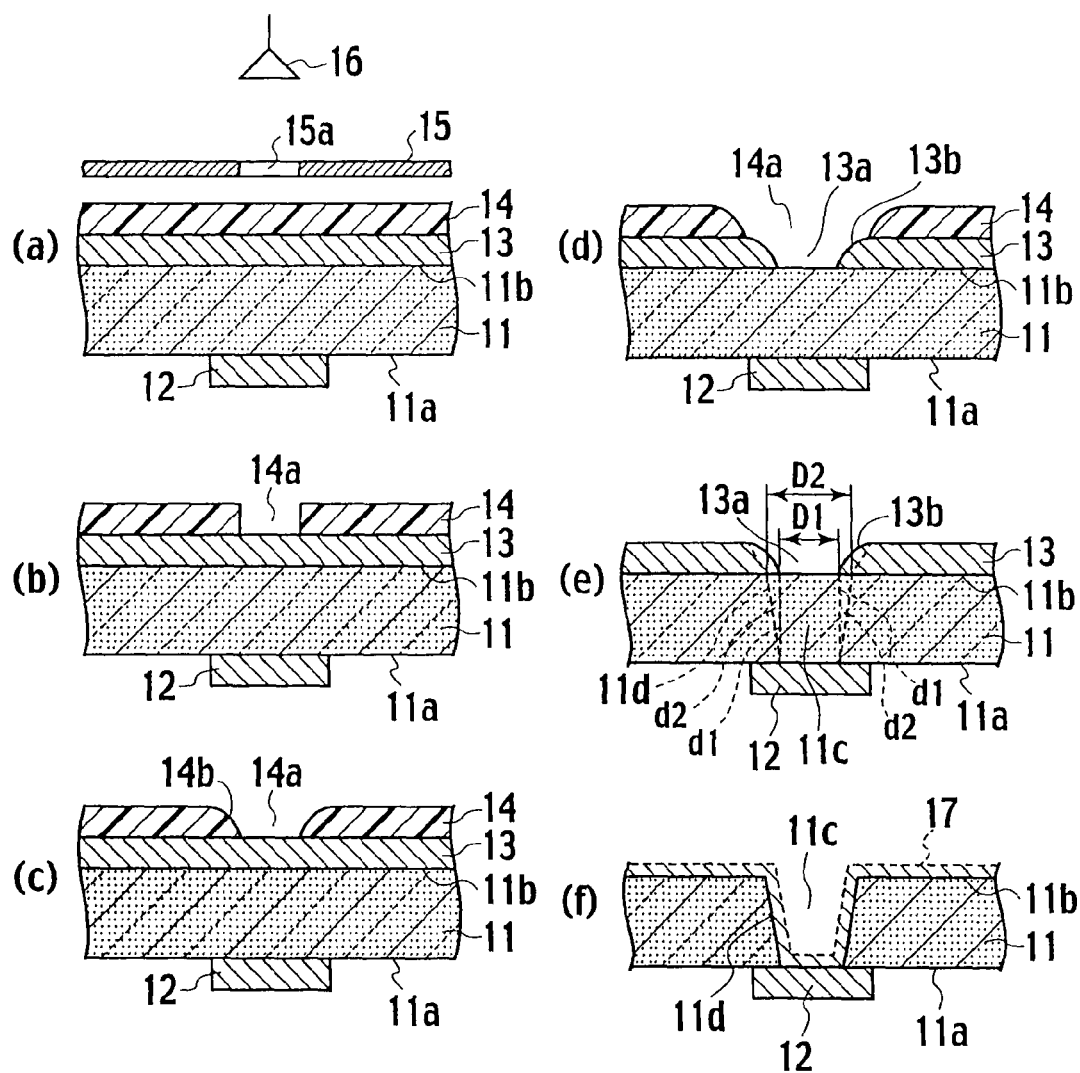
FIG. 1 It is a schematic section structure for explaining a formation method of a VIA-hole applied to a part of a fabrication method of a semiconductor device according to a first embodiment of the present invention: (*a*) a photo lithography process chart; (*b*) a formation process chart of a first aperture 14*a*; (*c*) a formation process chart of a first tapered region 14*b*; (*d*) an etching process chart of a mask 13; (*e*) a process chart which uses the mask 13 to form a third aperture 11*c* by etching of a semi-insulating substrate 11; and (*f*) a process chart for forming a grounding electrode 17 to form a VIA-hole.

There will be described embodiments of the present invention, with reference to the drawings, where like members or elements are designated by like reference characters to eliminate redundancy, and some layers and their subsidiary regions are designated by the same reference characters for simplicity. Drawings are schematic, not actual, and may be inconsistent in between in scale, ratio, etc.

The embodiments to be described are embodiments of a technical concept or spirit of the present invention that is not limited to embodied specifics, and may be changed without departing from the spirit or scope of claims.

First Embodiment

FIG. 1 is a schematic section structure for explaining a formation method of a VIA-hole applied to a part of a fabrication method of a semiconductor device according to a first embodiment of the present invention: FIG. 1(a) shows a photo lithography process chart; FIG. 1(b) shows a formation process chart of a first aperture 14a; FIG. 1(c) shows a formation process chart of a first tapered region 14b; FIG. 1(d) shows an etching process chart of a mask 13; FIG. 1(e) shows a process chart which uses the mask 13 to form a third aperture 11c by etching of a semi-insulating substrate 11; and FIG. 1(f) shows a process chart for forming a grounding electrode 17 to form a VIA-hole.

The fabrication method of the semiconductor device according to the first embodiment of the present invention will be explained with reference to the process charts shown in the cross section of FIG. 1.

(a) As shown in FIG. 1(a), an electrode 12, which has a certain size is formed on, for example, the front side of one surface 11a of the semi-insulating substrate 11. The semi-insulating substrate 11 is composed of compound semiconductors, such as GaN or SiC, for example. The electrode 12 is formed with Ni etc. An earthing terminal etc. of a circuit element (not shown) formed on the semi-insulating substrate 11, for example, on one surface 11a, is connected to the electrode 12.

A mask layer 13 composed of metal, such as Al, is formed on the surface 11b of another side, for example, the back-side of the semi-insulating substrate 11. One of characteristics that an etching rate by etching gas used when performing dry etching of the semi-insulating substrate 11 is smaller than the semi-insulating substrate 11 is used for the metal which forms the mask layer 13, so as to mention later. Moreover, a resist layer 14 is formed on the mask layer 13.

A mask pattern 15 is placed on the upper part of the semi-insulating substrate 11 on which the mask layer 13 and the resist layer 14 are formed. For example, a transmission hole 15a is formed in a part of the mask pattern 15 letting light pass through. The mask pattern 15 is placed so as to become the physical placement relation, which the transmission hole 15a and the electrode 12 oppose. A luminous source 16 is placed on the opposite side of the semi-insulating substrate 11 on an illustrated upper part of the mask pattern 15, for example, on the basis of the mask pattern 15.

(b) Next, illuminate the resist layer 14 through the mask pattern 15 from the luminous source 16.

(c) Afterward, perform a developing procedure, and as shown in FIG. 1(b), form a first aperture 14a in a part with which the light is illuminated, for example, a position which opposes the electrode 12. At this time, the mask layer 13 is exposed to a bottom surface of the first aperture 14a. In addition, area size of the first aperture 14a is smaller than the area size of the electrode 12. At this point, the case of a positive resist is explained. However, a negative resist can also be used.

(d) Next, heat the resist layer 14. By the heating process, as shown in FIG. 1(c), an edge corner of marginal upper limit surrounding the first aperture 14a becomes smooth, and a first tapered region 14b where thickness becomes thin toward the first aperture 14a side is formed around the first aperture 14a circularly, for example.

(e) Next, etch the mask layer 13 using the first aperture 14a of the resist layer 14. The etching is performed by dry etching using Ar (argon) gas or halogen related gas, such as F and Cl, for example. According to the dry etching, as shown in FIG. 1(d), a second aperture 13a is formed in the mask layer 13, and the surface 11b of another side of the semi-insulating substrate 11 is exposed to a bottom of the second aperture 13a.

When etching the mask layer 13, as for the resist layer 14 which functions as a mask, the circumference of the first aperture 14a is the first tapered region 14b (FIG. 1(c)). Therefore, when etching the mask layer 13, also about the first tapered region 14b, the etching progresses to outside in order with the passage of time from an inner side where thickness near the first aperture 14a is thin, and a diameter of the first aperture 14a is expanded gradually.

Therefore, about the etching of the mask layer 13, first of all, a part exposed to a bottom of the first aperture 14a is etched. Then, with expansion of the diameter of the first aperture 14a of the resist layer 14, the etching progresses to outside gradually from an inner side about the mask layer 13, and a diameter of the second aperture 13a also expands gradually. At this time, the etching of the inner side of the mask layer 13 progresses rather than the outside. Therefore, a second tapered region 13b where thickness becomes thin gradually, for example toward the second aperture 13a side is formed around the second aperture 13a circularly, for example.

(f) Next, as shown in FIG. 1(e), remove the resist layer 14, and then etch the semi-insulating substrate 11 by using the mask layer 13. The etching of the semi-insulating substrate 11 is performed by dry etching using Ar gas or halogen related gas, such as F and Cl, for example.

First of all, the etching of the semi-insulating substrate 11 starts at a part exposed to a bottom of the second aperture 13a, for example, a range surrounded by a dotted line dl vertical to the surface of the semi-insulating substrate 11. Then, a third aperture 11c that passes through the semi-insulating substrate 11 is formed according to progress of the etching.

At this time, the etching goes to the outside where thickness is thick in order from an inner side where thickness is thin, and a diameter of the second aperture 13a is expanded in a second tapered region 13b of the mask layer 13, as well as the case of the resist layer 14 explained with FIG. 1(d). Therefore, as for the semi-insulating substrate 11, for example, an illustrated upper inside diameter of the third aperture 11c becomes gradually large with expansion of a diameter of the second aperture 13a in parallel to formation of the third aperture 11c. In this case, progress of etching of, for example, the illustrated upper part of the third aperture 11c, for example, a part located in the surface 11b of another side, becomes early. For this reason, as shown in a dotted line d2, the side of an inside diameter D2 of an aperture opened to the surface 11b of another side of the semi-insulating substrate 11 becomes larger than an inside diameter D1 of an aperture opened to the surface 11a of one side. Therefore, the third aperture 11c that has a third tapered region 11d where an inside diameter becomes small gradually toward the surface 11a of one side from the surface 11b of another side is formed.

(g) Next, as shown in FIG. 1(f), remove the mask layer 13.

(h) Then, as shown in FIG. 1(f), by methods, such as vacuum evaporation or electroplating, the conductive layer 17 which is composed of metal, such as Au, is formed in the surface 11b of another side of the semi-insulating substrate 11 and the inner surface 11d of the third aperture 11c, and the back side of the electrode 12 facing the third aperture 11c, and then a VIA hole is completed.

At this time, the electrode 12 has a form which fills up an aperture of the VIA hole which composes the VIA hole, for example. Moreover, the conductive layer 17 formed in the surface 11b of another side of the semi-insulating substrate 11 functions, for example as a ground conductor.

According to the above-mentioned embodiment, as shown in the dotted line d2 of FIG. 1(e), the whole of the third aperture 11c is tapered region 11d in the depth direction. In order to form the conductive layer 17 securely, it is preferable for the whole of the depth direction to be a tapered region. However, it may be a configuration which provides the tapered region in a part of third aperture 11c, for example, only partial region of the illustrated upper part of the third aperture 11c continuous from the surface 11b of another side. In this case, although an effect is small compared with the case where the whole is the tapered region, an effect which forms a conductive layer securely is obtained.

Moreover, when forming the conductive layer 17 in the inner surface of the third aperture 11c, the mask layer 13 is removed. However, the conductive layer 17 can also be formed from on the mask layer 13, without removing the mask layer 13.

Figure 2:
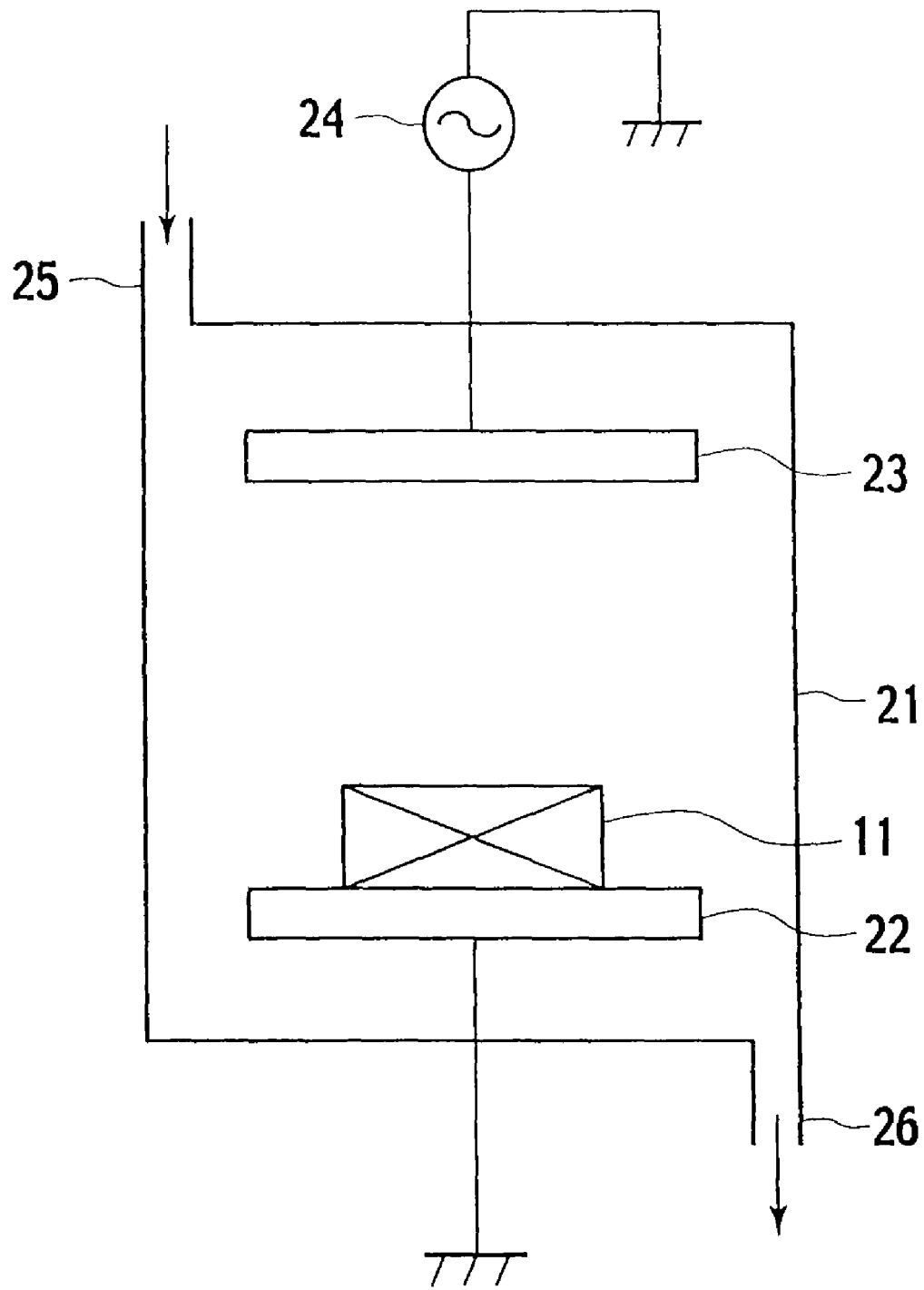
FIG. 2 A schematic configuration diagram of an etching apparatus applied to the VIA-hole formation process for a semi-insulating substrate in a fabrication method of the semiconductor device according to the first embodiment of the present invention.

FIG. 2 shows a schematic configuration diagram of an etching apparatus applied to the VIA hole formation process for the semi-insulating substrate, in the fabrication method of the semiconductor device according to the first embodiment of the present invention.

At this point, the method for etching the semi-insulating substrate 11 will be explained with reference to the schematic structural drawing of FIG. 2.

A cathode 22 is placed, for example, at the lower side in a chamber 21. An anode 23 is placed at the upper part of the cathode 22 in a position which opposes the cathode 22. For example, a high-frequency power source 24 is connected to the anode 23, and the cathode 22 is grounded. And, the semi-insulating substrate 11 to be etched is mounted, for example on the cathode 22. Moreover, a supply port 25 for supplying etching gas, for example, Ar gas, or gas including halogen related elements, such as F and Cl, is provided at the illustrated upper part of the chamber 21. An exhaust port 26 for exhausting the gas in the chamber 21 is provided at the illustrated lower part of the chamber 21.

In the above-mentioned configuration, the etching gas is supplied into the chamber 21 from the supply port 25. The etching gas is excited by high frequency which the high frequency power source 24 generates, and the semi-insulating substrate 11 is etched by, for example an action of accelerated ion etc.

According to the above-mentioned configuration, the tapered region is provided in the inner surface of the VIA hole of the semi-insulating substrate. In this case, the aperture of one side of the VIA hole becomes large, and an inclination of the inner surface of the VIA hole becomes a form where metal forming the conductive layer is received. Therefore, when forming the conductive layer by methods, such as vacuum evaporation and electroplating, the conductive layer is formed securely and the disconnection caused by step is prevented.

Moreover, when a GaN substrate, a SiC substrate, a sapphire substrate, or diamond substrate, etc. are used as the semi-insulating substrate, these substances are deficient in reactivity at the time of etching in order to form the VIA hole, and it is difficult to form the tapered region in the inner surface of the VIA hole. For example, since chemical etching is difficult for SiC, it becomes strong physical etching of sputtering nature, such as dry etching. Therefore, when forming the VIA hole, it is difficult to form the tapered region and it becomes a vertical VIA hole easily.

However, if a mask layer which is composed of Al etc. and which performed taper machining is used, also for a GaN substrate or a SiC substrate, the tapered region can be easily formed in the inner surface of the VIA hole, and the VIA hole without the disconnection caused by step is obtained.

Moreover, even if the aperture of one side of the VIA hole which forms the VIA hole is large, the aperture by the side of the electrode is small. Therefore, it is not necessary to enlarge the electrode, and a circuit is prevented from becoming over-size.

Other Embodiments

The present invention has been described by the first embodiment and its modification, as a disclosure including associated description and drawings to be construed as illustrative, not restrictive. With the disclosure, artisan might easily think up alternative embodiments, embodiment examples, or application techniques.

In addition, it cannot be overemphasized that the amplifying elements are applicable not only by FET (Field Effect Transistor) but other amplifying elements, such as HEMT (High Electron Mobility Transistor), LDMOS (Lateral Doped Metal-Oxide-Semiconductor Field Effect Transistor), and HBT (Hetero-junction Bipolar Transistor).

Such being the case, the present invention covers a variety of embodiments, whether described or not. Therefore, the technical scope of the present invention is appointed only by the invention specific matter related appropriate scope of claims from the above-mentioned explanation.

According to the present invention, the tapered region where the inside diameter changes to the inner surface of the VIA hole which composes the VIA hole is formed. Therefore, the conductive layer is securely formed in the inner surface of the VIA hole, and the semiconductor device which has the VIA hole without the disconnection caused by step, and the fabrication method for the same are achieved.

The semiconductor device and the fabrication method for the same according to the embodiments of the present invention are applied to a semiconductor device in which it is difficult for thinned layer, such as a SiC substrate and a GaN wafer substrate, and has wide industrial application fields, such as an internal consistency type power amplification element, an electric power MMIC (Monolithic Microwave Integrated Circuit), a microwave power amplifier, and a millimeter wave power amplifier.

The invention claimed is:

1. A fabrication method of a semiconductor device comprising:
    a first step of forming a mask layer which is composed of material whose etching rate is smaller than a semi-insulating substrate on a surface of another side of the semi-insulating substrate where an electrode is formed on a surface of one side;
    a second step of forming a resist layer on the mask layer;
    a third step of illuminating the resist layer through a mask pattern which provides a region along which light passes, and forming a first aperture in the resist layer;
    a fourth step of heating the resist layer in which the first aperture is formed, and forming a first tapered region where a thickness becomes thin toward the first aperture side around the first aperture of the resist layer;
    a fifth step, after the fourth step, of forming a second aperture such that a part of the surface of the another side of the semi-insulating substrate is exposed by etching the mask layer using the first aperture of the resist layer, and forming a second tapered region where a thickness becomes thin toward the second aperture side around the second aperture;

a sixth step, after the fifth step, of removing the resist layer which remains on the mask layer;

a seventh step, after the sixth step, of forming a third aperture having a third tapered region where an inside diameter of a part located in the surface of the another side of the semi-insulating substrate is larger than an inside diameter of a part located in the surface of the one side by etching the semi-insulating substrate using the second aperture; and an eighth step of forming a conductive layer in an inner surface of the third aperture.

2. The fabrication method of the semiconductor device according to claim 1, wherein a material of the mask layer is aluminum.

3. The fabrication method of the semiconductor device according to claim 1, wherein the semi-insulating substrate is a GaN substrate or a SiC substrate.

* * * * *